Nov. 21, 1967 G. V. DEVERALL 3,354,316
OPTOELECTRONIC DEVICE USING LIGHT EMITTING
DIODE AND PHOTODETECTOR
Filed Jan. 6, 1965

INVENTOR
G. V. DEVERALL
BY
Roderick B. Anderson
ATTORNEY

United States Patent Office 3,354,316

Patented Nov. 21, 1967

3,354,316

OPTOELECTRONIC DEVICE USING LIGHT EMITTING DIODE AND PHOTODETECTOR

George V. Deverall, Red Bank, N.J., assignor to Bell Telephone Laboratories, Incorporated, New York, N.Y., a corporation of New York Filed Jan. 6, 1965, Ser. No. 423,650
12 Claims. (Cl. 250—217)

Figure 1:
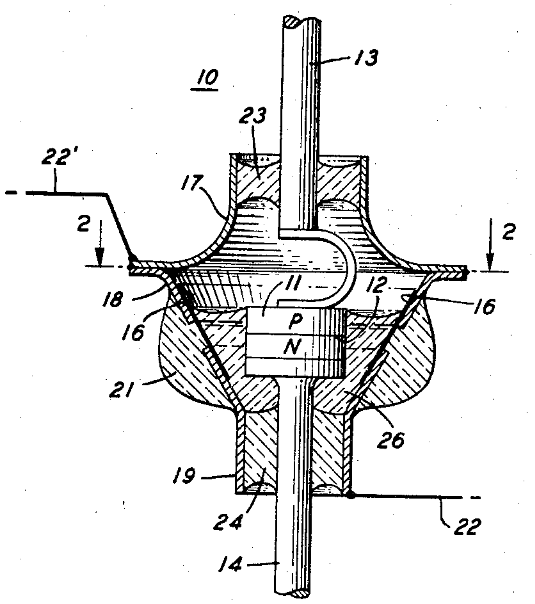

This invention relates to optoelectronic devices, and more particularly, to optoelectronic relays using semiconductor light sources.

One known type of optoelectronic device comprises a semiconductor junction diode displaced a small distance from a photodetector. When the diode is subjected to a predetermined voltage, light is radiated from the junction. The photodetector may be of the type which generates electrical current in response to light impingement, in which case the device may be used as a conventional relay; i.e., the generated current is used to directly actuate other apparatus. Alternatively, the photodetector may be used as a variable resistance device; when light impinges on it; its effective electrical resistance is substantially reduced. Photodetector materials having this latter characteristic are generally known as photoconductors. The term "optoelectronic relay" as used herein includes both photoconductor variable resistance devices and conventional photodetector relays.

It is an object of this invention to increase the efficiency of optoelectronic relays.

It is another object of this invention to provide optoelectronic relays of rugged and sturdy construction.

These and other objects of the invention are attained in an illustrative embodiment thereof comprising a cylindrical semiconductor diode having a junction which describes a circle around its outer cylindrical surface. The junction radiates light radially from its circular periphery in response to a predetermined voltage applied across the diode. Surrounding the diode junction is a hollow photoconductor. Because the photoconductor surrounds the entire junction, it receives substantially all of the light emitted from the junction and is therefore more efficient than present optoelectronic relays which employ a flat photoconductor for receiving light from only a part of a diode junction.

In accordance with another feature of the preferred form of the invention, the diode and photoconductor are bonded together by an arsenic-sulfur-iodine glass medium which completely surrounds the junction. This type of glass transmits light more efficiently from the diode source to the photoconductor target than a conventional air gap because it has a high index of refraction which approximately matches the indices of refraction of the diode and the photoconductor. As will be explained later, reflection losses are minimized when the index of refraction of the transmitting medium approximates those of the source and the target. The diode is preferably a gallium-arsenide light emitting diode, while the photoconductor is preferably made of either thallous-sulfide or cadmium selenide, each of which has a high index of refraction which approximates that of the glass medium.

Further, arsenic-sulfur-iodine glass has been found to have good wetting characteristics with respect to a gallium-arsenide diode and either a thallous-sulfide, or a cadmium selenide photoconductor. This means that a lossy reflective interface will not be established between the glass medium and either the diode or the photoconductor as would be true if some other glass media were used. Finally, the arsenic-sulfur-iodine glass desirably has a high resistivity, a low melting point, and substantial chemical inertness, all of which are important characteristics for reasons that will be explained later. The photoconductor may desirably be coated with silicon monoxide for increasing its longevity; the silicon monoxide likewise has favorable characterstics with respect to the arsenic-sulfur-iodine glass medium. In addition to improving the efficiency of the device, the glass medium makes it structurally more rugged and reliable because it bonds the diode and photoconductor together in a sturdy unitary configuration.

In accordance with another feature of the preferred form of the invention, the device is encased by an encapsulation comprising a roughly frusto-conical base welded to a dish-shaped cover. The cover is glass sealed to one of the diode leads while the base is glass sealed to the other diode lead. The base is divided into two conductive base portions which are joined by an annular glass seal. The photoconductor is defined by a thin coating of thallous-sulfide which is evaporated onto the inner surface of the glass seal such as to overlap the two base portions. In this way, the two base portions are electrically insulated by the glass seal except during periods of photoconductor energization by the light emitting diode. The conductive base portions, the glass seal, and the photoconductor constitute part of a variable resistance device in an electrical ciruit while also cooperating to give a sturdy and rugged encapsulation.

Figure 2:
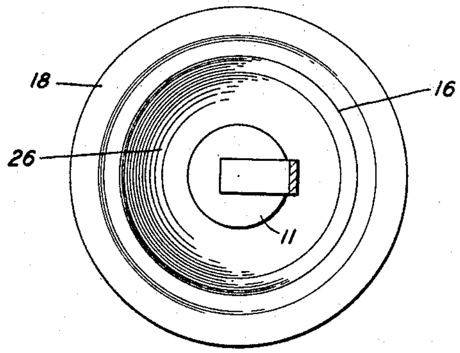

These and other objects and features of my invention will be more clearly understood from a consideration of the following detailed description, taken in conjunction with the accompanying drawings in which:

FIG. 1 is a sectional view of an optoelectronic device in accordance with the invention; and FIG. 2 is a view taken along line 2—2 of FIG. 1.

Referring now to the drawing, there is shown an optoelectronic device 10 comprising a substantially cylindrical light-emitting junction diode 11. Diode 11 is preferably a gallium-arsenide light-emitting diode having p-type and n-type portions which are separated by a junction 12. Connected to opposite ends of the diode 11 are a pair of conductive leads 13 and 14. When a predetermined voltage difference occurs between leads 13 and 14, light is radiated from junction 12. Because of the cylindrical construction of diode 11, junction 12 describes a circle around the periphery of the diode and emits light radially outwardly.

Completely surrounding the junction 12 is a frusto-conical photoconductor 16. Photoconductor 16 may advantageously comprise a layer of either thallous-sulfide or cadmium selenide which may be coated in a known manner with a thin film of silicon monoxide for increasing its durability. The diode and photoconductor are contained within an encapsulation comprising a dish-shaped cover 17, an upper base portion 18 and a lower base portion 19. The upper and lower base portions 18 and 19 are insulated from each other by an annular glass seal 21. The inner surface of the glass seal 21 which lies between upper and lower base portions 18 and 19 is ground to a surface which is flush with the frusto-conical inner surfaces of the upper and lower base portions. As can be seen from the drawing, the photoconductor 16 is formed by coating the inner surface of glass seal 21 and adjacent inner surface regions of base portions 18 and 19 with appropriate photoconductive material as described above. The cover portion 17 and the base portions 18 and 19 are made of a conductive material which is appropriate for glass sealing such as Kovar which is composed of approximately 29% nickel, 17% cobalt, 0.2% manganese and the rest iron (Engineering alloys by N. E. Woldman, Reinhold Publishing Co., 1962, page 278). As shown schematically in FIG. 1, the base portion 19 is connected to a conductor 22 while the cover 17 is connected to a conductor 22'. The upper base portion 18 and the cover 17 are bonded together by a circumferential weld. The cover 17 is bonded to lead 13 by a glass seal 23 while the lower base portion 19 is bonded to lead 14 by a glass seal 24. The seals 23 and 24 are made hermetically in a known manner to maintain either a vacuum or other chemically inert atmosphere within the encapsulation. Seals 21, 23 and 24 are all made from conventional glass, such as Corning 705 glass.

Optoelectronic device 10 may be used to change abruptly the resistance between lines 22 and 22'. When light is emitted from junction 12, it impinges on photoconductor 16 to reduce radically the electrically resistance between upper and lower base portions 18 and 19. This, of course, abruptly reduces the resistance in an electrical circuit comprising conductors 22 and 22'. Optoelectronic device 10 may be particularly useful in an electronic switching system as a scan point element. When a subscriber lifts a telephone from its cradle to establish an "off-hook" state, the diode 12 will emit light to energize the photoconductor 16. A scanning device then detects the reduced resistance in transmission line 22–22' and thereby supplies dial tone to the subscriber's telephone line. This particular type of variable resistance device gives minimal interference with the current flowing through leads 13 and 14. Optoelectronic device 10 could also of course be modified for use as a conventional photodetector relay.

Since the hollow photoconductor 16 completely surrounds the junction 12, it intercepts substantially all of the light radiated from the junction and is for this reason more efficient than conventional optoelectronic relays which use a flat photoconductor that is displaced merely to one side of the junction.

The diode 11 and the photoconductor are bonded together by a highly refractive glass medium 26. Glass medium 26 preferably has a composition by weight of about 30% arsenic, 20% sulfur, and 50% iodine, which has an index of refraction of approximately 2.4. This index is very high as compared to a typical refractive index of 1.5 for conventional glasses. This is important because it roughly matches the indices of refraction of the gallium-arsenide diode 11 and the photoconductor 16. It can be shown that reflection losses are minimized as the refractive index of the light transmitting medium approaches those of the diode light source 11 and the photoconductor 16. It can further be shown that the indices of refraction of the gallium-arsenside diode and the thallous-sulfide photoconductor, are 3.3 and 2.8 respectively. The photoconductor may also be made of cadmium selenide, which has an index of refraction of 2.8. Hence, the high index of refraction of glass 26 substantially reduces the reflection losses relative to conventional optoelectronic relays which use an air gap between the light emitting diode and the photoconductor.

The arsenic-sulfur-iodine glass is admirably suited for bonding the diode and the photoconductor together for several other reasons. First, it is substantially chemically inert, and therefore does not combine with constituents of either the diode or the photoconductor. Secondly, it has a relatively low melting point. As a result, it is not rigid or brittle at room temperatures even though it firmly bonds and encases the diode. Higher melting point glasses tend to be more brittle at room temperatures and are more likely to separate from the diode or the photoconductor, rather than support them properly as is required for a generally rugged configuration. Third, it has a high resistivity for insulating the diode and the upper and lower base portions 18 and 19. Finally, it has a good wetting characteristic with respect to the gallium-arsenide diode, the thallous-sulfide or a cadmium selenide photoconductor, and the silicon monoxide protective coating on the photoconductor. This means that the glass will adhere firmly to the diode and the photoconductor without establishing a partially reflective interface with either of them as would be true if many other glass media were used.

Although the above-described arsenic-sulfur-iodine glass is considered to be the best material for glass medium 26, other glasses could be used depending on the requirements to which device 10 is to be subjected. Arsenic-thallium-sulfur glass has a desirably high index of refraction, but it also has a relatively high melting point, and therefore its rigidity at room temperatures may cause it to become separated from the diode or the photoconductor if it is subjected to stresses. Arsenic-sulfur-bromine glass has many of the above-described desirable characteristics but it has a lower index of refraction than the preferred glass and is therefore not as efficient for transmitting light. For purposes of this specification, "highly refractive glass" shall mean a glass having an index of refraction of more than 2. To the best of my knowledge, only chalcogenide glasses meet this requirement. Also, to the best of my knowledge, all semiconductor light sources and photoconductors are highly refractive, and so this particular feature could be used with various other light sources and photoconductors.

It can be appreciated that the optoelectronic device 10 which has been described also offers substantial advantages of efficiency and rugged durability. The Kovar portions 17, 18, and 19 constitute a series connection between conductors 22 and 22', form a major part of the rugged encapsulation of the device, and have a sufficiently low coefficient of expansion to make a good glass seal with the leads 13 and 14. The annular glass seal 21 insulates, seals, and supports the two conductive base portions 18 and 19 and also provides a supporting surface for part of the photoconductor 16. The frusto-conical configuration of the photoconductor 16 intercepts substantially all of the light emitted by the junction 12 and therefore increases device efficiency. The glass medium 26 increases light transmission efficiency and makes the device more rugged by bonding the diode with the photoconductor and the general encapsulation. All these elements are arranged to optimally support each other and therefore result in a device of extremely sturdy and durable construction. The various features outlined above can, of course, be used in any of numerous combinations; various other modifications and embodiments may be devised by those skilled in the art without departing from the spirit and scope of the invention.

What is claimed is:

1. An optoelectronic device comprising:
a substantially cylindrical semiconductive diode for emitting light from a junction thereof in response to a predetermined voltage;
a hollow frusto-conical photodetector surrounding the junction;
the photodetector and the diodes being bonded together by arsenic-sulfur-iodine glass which completely surrounds said junction;
and an encapsulation for hermetically enclosing the diode;
at least part of the encapsulation being made of conductive material which is conductively connected to the photodetector.

2. The optoelectronic device of claim 1 wherein:
the diode is a gallium-arsenside diode;
and the photodetector is made of a material having an index of refraction of approximately 2.8.

3. The optoelectronic device of claim 1 further comprising:
a pair of conductive leads connected to opposite sides of the diode and extending through the encapsulation;
and wherein the conductive portion of the encapsulation is made of Kovar which is hermetically glass sealed to each of the conductive leads.

4. An optoelectronic device comprising:
a semiconductive diode having a junction for emitting light radially in response to a predetermined voltage;
a hollow photodetector surrounding the junction;
substantially the entire inner surface of the photodetector being exposed to the light emitting junction;

and means for efficiently transmitting light from the diode to the photodetector comprising a medium of highly refractive glass bonded to both the diode and the photodetector;

the refractive index of the glass medium being approximately equal to the refractive indices of both the semiconductive diode and the photodetector.

5. The optoelectronic device of claim 4 wherein:

the glass medium has a composition of approximately 30% arsenic, 20% sulfur, and 50% iodine.

6. An optoelectronic device comprising:

means comprising a semiconductor junction light source for emitting light in response to a predetermnied voltage;

first and second conductive leads connected to opposite ends of the light source;

first and second hollow conductive base portions surrounding at least part of the light source;

means comprising a substantially annular glass seal for bonding together the two base portions;

the inside surface of the glass seal being substantially flush with the inside surfaces of the base portions;

a hollow photodetector surrounding the light source;

said photodetector being bonded to part of the inside surface of the glass seal and to part of the inside surface of the two base portions;

substantially the entire inner surface of the photodetector being exposed to the light source;

a first conductor connected to the first base portion;

and a second conductor connected to the second base portion.

7 The optoelectronic device of claim 6 wherein:

the photodetector comprises means for varying the electrical resistance between the first and second conductors.

8. The optoelectronic device of claim 6 further comprising:

means comprising a glass medium completely surrounding the light source for bonding together the light source and the photodetector.

9. The optoelectronic device of claim 8 wherein:

the light source, photodetector and glass medium are all made of highly refractive materials;

10. The optoelectronic device of claim 9 wherein:

the light source is a gallium-arsenide junction diode;

the photodetector is made of cadmium selenide coated with silicon monoxide;

and the glass medium has a composition of approximately 30% arsenic, 20% sulfur, and 50% iodine.

11. The optoelectronic device of claim 6 further comprising:

a substantially dish-shaped cover portion having a central aperture through which the first conductive lead extends;

the cover portion being circumferentially welded along its periphery to the first base portion;

the second base portion having a central aperture through which the second conductive lead extends;

the second conductive lead being glass sealed to the second base portion;

and the first conductive lead being glass sealed to the cover portion.

12. An optoelectronic device comprising:

means comprising a semiconductor junction light source for emitting light in response to a predetermined voltage;

first and second hollow conductive base portions surrounding part of the light source;

means comprising a hollow glass seal for bonding together the two base portions;

the inside surface of the glass seal being substantially flush with the inside surfaces of the base portions; and a photoconductor bonded to the inside surface of the glass seal and to part of the inside surfaces of the two base portions;

substantially the entire inner surface of the photoconductor being exposed to the light source.

References Cited

UNITED STATES PATENTS

| | | | |
|---|---|---|---|
| 2,694,168 | 11/1954 | North et al. | 317—235 |
| 3,110,816 | 11/1963 | Kaisler et al. | 250—227 |
| 3,194,967 | 7/1965 | Mash | 250—211 |
| 3,217,169 | 11/1965 | Grimmeiss et al. | 250—217 |

OTHER REFERENCES

American Institute of Physics Handbook; 2nd Edition; McGraw Hill; pp. 6–116; QC–61–A5–1963 (Copy in Group 256).

WALTER STOLWEIN, *Primary Examiner.*